(12) United States Patent
Sherman

(10) Patent No.: US 9,577,133 B2
(45) Date of Patent: Feb. 21, 2017

(54) FLEXIBLE CONNECTORS OF BUILDING INTEGRABLE PHOTOVOLTAIC MODULES FOR ENCLOSED JUMPER ATTACHMENT

(75) Inventor: Adam C. Sherman, Newark, CA (US)

(73) Assignee: BEIJING APOLLO DING RONG SOLAR TECHNOLOGY CO., LTD., Beijing (CN)

( * ) Notice: Subject to any disclaimer, the term of this patent is extended or adjusted under 35 U.S.C. 154(b) by 459 days.

(21) Appl. No.: 13/298,178

(22) Filed: Nov. 16, 2011

(65) Prior Publication Data
US 2013/0118558 A1    May 16, 2013

(51) Int. Cl.
*H01L 31/048* (2014.01)
*H01L 31/05* (2014.01)
(Continued)

(52) U.S. Cl.
CPC .......... *H01L 31/0508* (2013.01); *H01L 31/05* (2013.01); *H01L 31/0504* (2013.01);
(Continued)

(58) Field of Classification Search
CPC ............. H01L 31/0482; H01L 31/0483; H01L 31/0485; H01L 31/0465; H01L 31/05; H01L 31/0504; H01L 31/05008; H01L 31/0512; H01L 31/0516; H01L 31/008; H01L 31/05165; Y02B 10/12; H02S 20/25; H02S 40/30; H02S 40/34; H02S 40/36; H01R 35/02; H01R 13/72

See application file for complete search history.

(56) References Cited

U.S. PATENT DOCUMENTS

| | | | |
|---|---|---|---|
| 3,291,636 | A | 12/1966 | Reighter et al. |
| 3,325,769 | A | 6/1967 | Travis |

(Continued)

FOREIGN PATENT DOCUMENTS

| | | |
|---|---|---|
| EP | 2429002 | 3/2012 |
| WO | 2009/137347 | 11/2009 |

(Continued)

OTHER PUBLICATIONS

U.S. Appl. No. 13/046,453, filed Mar. 11, 2011, entitled "Separable Flexible Photovoltaic Connector" by Adam C. Sherman et al.
(Continued)

*Primary Examiner* — Allison Bourke
*Assistant Examiner* — Edward Schmiedel
(74) *Attorney, Agent, or Firm* — Weaver Austin Villeneuve & Sampson LLP

(57) ABSTRACT

Provided are novel Building Integrable Photovoltaic (BIPV) modules having one or more connectors that are movable between extended and retracted positions. Connector adjustment may be performed in the field, for example, during installation of a module. In certain embodiments, a connector includes a connector body and extension body. The extension body flexibly attaches the connector body to the module and allows the connector body to move with respect to the module edge. In an extended position, the connector body is positioned closer to the edge and is configured to make electrical connections to a joiner connector for interconnecting with an adjacent module. In a retracted positioned, the connector body is positioned further from the edge and is configured to make electrical connections to a jumper for interconnecting the conductive elements of the connector. In certain embodiments, a jumper does not protrude beyond the edge when connected to the connector body.

17 Claims, 9 Drawing Sheets

(51) Int. Cl.
*H01R 13/72* (2006.01)
*H01R 35/02* (2006.01)
*H02S 20/25* (2014.01)
*H02S 40/34* (2014.01)
*H02S 40/30* (2014.01)
*H02S 40/36* (2014.01)

(52) U.S. Cl.
CPC ...... *H01L 31/0512* (2013.01); *H01L 31/0516* (2013.01); *H01R 13/72* (2013.01); *H01R 35/02* (2013.01); *H02S 20/25* (2014.12); *H02S 40/30* (2014.12); *H02S 40/34* (2014.12); *H02S 40/36* (2014.12); *Y02B 10/12* (2013.01); *Y02E 10/50* (2013.01)

(56) References Cited

U.S. PATENT DOCUMENTS

| | | | |
|---|---|---|---|
| 3,838,234 A | 9/1974 | Peterson | |
| 4,754,285 A | 6/1988 | Robitaille | |
| 4,847,818 A | 7/1989 | Olsen | |
| 5,059,254 A | 10/1991 | Yaba et al. | |
| 5,179,733 A | 1/1993 | Matsui | |
| 5,209,987 A * | 5/1993 | Penneck et al. | 428/610 |
| 5,218,577 A | 6/1993 | Seager | |
| 5,232,518 A | 8/1993 | Nath et al. | |
| 5,391,235 A | 2/1995 | Inoue | |
| 5,526,006 A | 6/1996 | Akahane et al. | |
| 6,111,189 A * | 8/2000 | Garvison et al. | 136/244 |
| 6,456,724 B1 | 9/2002 | Watanabe | |
| 6,534,768 B1 * | 3/2003 | Ciurczak et al. | 250/339.02 |
| 6,576,830 B2 | 6/2003 | Nagao et al. | |
| 6,707,689 B2 | 3/2004 | Momota et al. | |
| 6,840,799 B2 | 1/2005 | Yoshikawa et al. | |
| 6,967,278 B2 | 11/2005 | Hatsukaiwa et al. | |
| 7,056,145 B2 | 6/2006 | Campbell, III et al. | |
| 7,138,578 B2 | 11/2006 | Komamine | |
| 7,297,867 B2 | 11/2007 | Nomura et al. | |
| 7,387,537 B1 * | 6/2008 | Daily | H01R 13/6272 439/281 |
| 7,708,578 B1 | 5/2010 | Lenox | |
| 7,713,089 B2 * | 5/2010 | Faust | H01L 31/02008 136/251 |
| 7,726,301 B2 | 6/2010 | Shin et al. | |
| 7,762,832 B2 | 7/2010 | Minnick | |
| 7,789,700 B2 | 9/2010 | Wang et al. | |
| 7,824,191 B1 | 11/2010 | Browder | |
| 7,854,095 B2 | 12/2010 | Banister | |
| 7,963,802 B2 | 6/2011 | Corneille et al. | |
| 7,987,641 B2 | 8/2011 | Cinnamon | |
| 8,147,274 B2 | 4/2012 | Mizukami | |
| 8,192,207 B2 | 6/2012 | Iida | |
| 8,286,393 B2 | 10/2012 | Reyal et al. | |
| 8,333,040 B2 | 12/2012 | Shiao et al. | |
| 8,414,308 B1 | 4/2013 | Meyers | |
| 8,613,169 B2 | 12/2013 | Sherman et al. | |
| 8,656,657 B2 * | 2/2014 | Livsey | F24J 2/5245 52/173.3 |
| 8,695,289 B2 * | 4/2014 | Koch | H01L 31/05 136/251 |
| 8,813,460 B2 * | 8/2014 | Cinnamon | F24J 2/5211 136/244 |
| 9,112,080 B1 | 8/2015 | Corneille et al. | |
| 9,231,123 B1 | 1/2016 | Sherman | |
| 2003/0098059 A1 | 5/2003 | Hanoka | |
| 2003/0227663 A1 | 12/2003 | Agrawal et al. | |
| 2005/0000562 A1 | 1/2005 | Kataoka et al. | |
| 2006/0054213 A1 | 3/2006 | Baret | |
| 2008/0053511 A1 * | 3/2008 | Nakamura | 136/244 |
| 2008/0149170 A1 | 6/2008 | Hanoka | |
| 2008/0160804 A1 * | 7/2008 | Daily | H01R 13/6272 439/152 |
| 2008/0196756 A1 | 8/2008 | Basol | |
| 2008/0289681 A1 | 11/2008 | Adriani et al. | |
| 2008/0314432 A1 | 12/2008 | Paulson et al. | |
| 2009/0078299 A1 * | 3/2009 | Cinnamon | F24J 2/5211 136/244 |
| 2009/0084432 A1 | 4/2009 | Kosmehl | |
| 2009/0126782 A1 | 5/2009 | Krause et al. | |
| 2009/0145746 A1 | 6/2009 | Hollars | |
| 2009/0215304 A1 * | 8/2009 | Faust | H01L 31/02008 439/358 |
| 2010/0146878 A1 * | 6/2010 | Koch | H01L 31/05 52/173.3 |
| 2010/0326498 A1 | 12/2010 | Corneille et al. | |
| 2011/0048507 A1 * | 3/2011 | Livsey | F24J 2/5245 136/251 |
| 2011/0139288 A1 | 6/2011 | Rushlander et al. | |
| 2011/0183540 A1 | 7/2011 | Keenihan et al. | |
| 2011/0220180 A1 * | 9/2011 | Cinnamon | H01L 31/048 136/251 |
| 2011/0277811 A1 | 11/2011 | Corneille et al. | |
| 2016/0027944 A1 | 1/2016 | Corneille et al. | |

FOREIGN PATENT DOCUMENTS

| | | |
|---|---|---|
| WO | 2009/137348 | 11/2009 |
| WO | 2009/137351 | 11/2009 |
| WO | 2009/137352 | 11/2009 |
| WO | 2009/137353 | 11/2009 |

OTHER PUBLICATIONS

U.S. Appl. No. 13/046,461, filed Mar. 11, 2011, entitled "Electrical Connectors of Building Integrable Photovoltaic Modules" by Jason S. Corneille et al.
U.S. Appl. No. 13/042,320, filed Mar. 7, 2011, entitled "Sliding Electrical Connectors for Building Integrable Photovoltaic Modules" by Michael C. Meyers.
U.S. Appl. No. 13/043,227, filed Mar. 8, 2011, entitled "Flexible Connectors for Building Integrable Photovoltaic Modules" by Adam C. Sherman.
U.S. Appl. No. 13/046,453, Office Action mailed Jan. 9, 2012.
U.S. Appl. No. 13/046,453, Final Office Action mailed May 18, 2012.
U.S. Appl. No. 13/042,320, Office Action mailed Jul. 26, 2012.
U.S. Appl. No. 13/042,317, Notice of Allowance mailed Dec. 7, 2012.
U.S. Appl. No. 13/046,461, Office Action mailed Apr. 9, 2013.
U.S. Appl. No. 13/046,461, Final Office Action mailed Oct. 8, 2013.
U.S. Appl. No. 13/046,461, Office Action mailed Sep. 3, 2014.
U.S. Appl. No. 13/046,461, Notice of Allowance mailed Apr. 13, 2015.
U.S. Appl. No. 13/046,461, Notice of Allowance mailed Aug. 26, 2015.
U.S. Appl. No. 13/345,040, Notice of Allowance mailed Apr. 24, 2013.

* cited by examiner

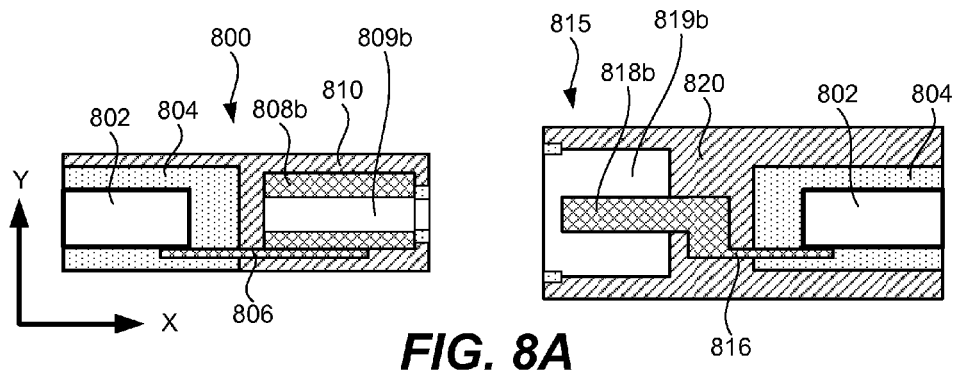
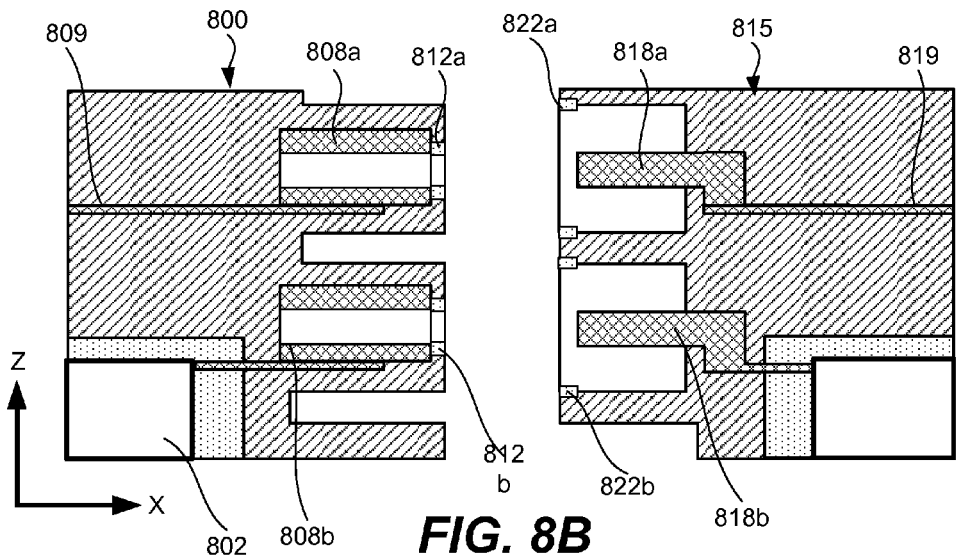
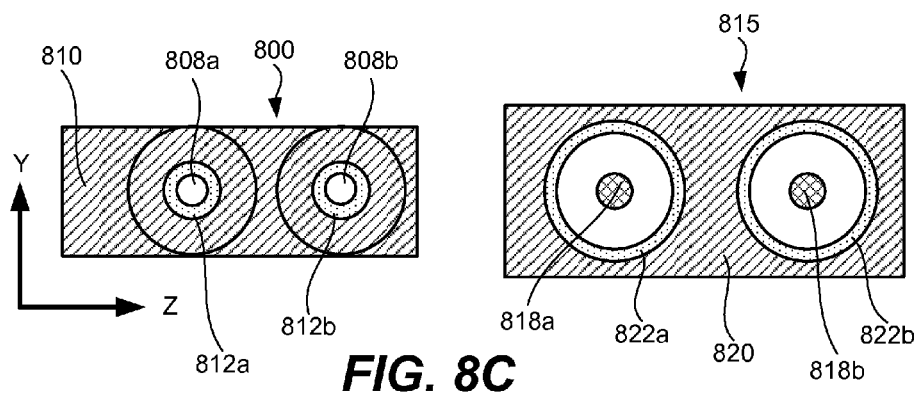

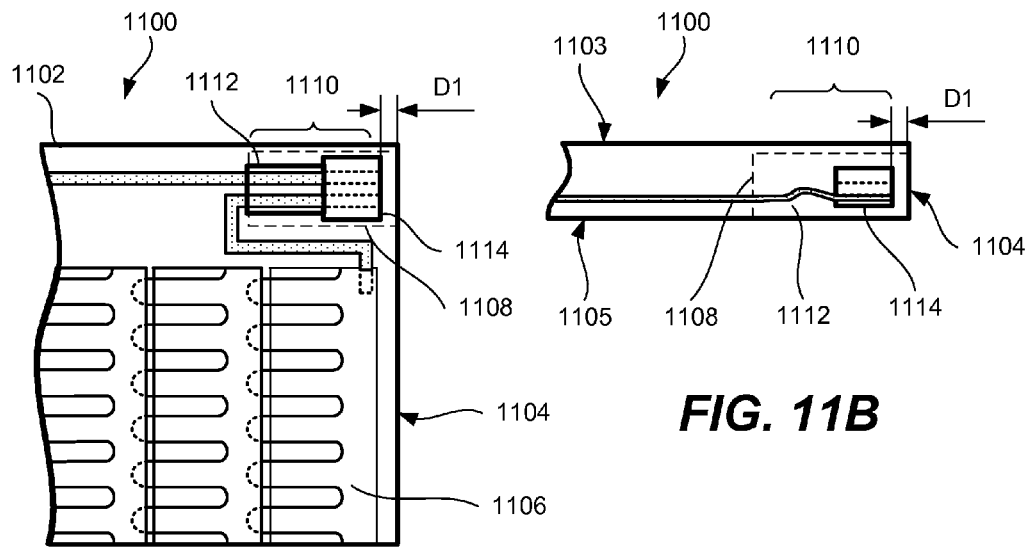
FIG. 11A
FIG. 11B
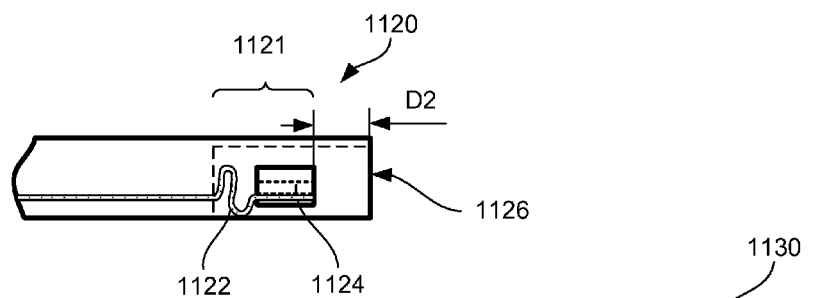
FIG. 11C
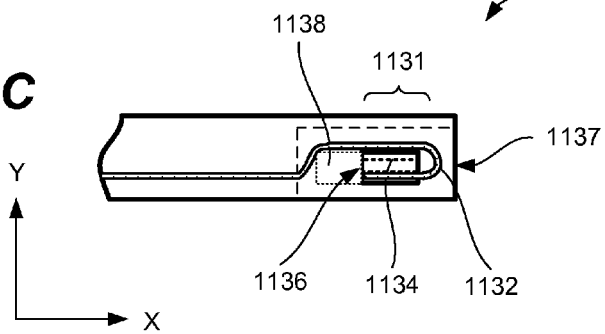
FIG. 11D

FLEXIBLE CONNECTORS OF BUILDING INTEGRABLE PHOTOVOLTAIC MODULES FOR ENCLOSED JUMPER ATTACHMENT

BACKGROUND

Photovoltaic cells are widely used for electricity generation, with one or more photovoltaic cells typically sealed within in a module. Multiple modules may be arranged into photovoltaic arrays used to convert solar energy into electricity by the photovoltaic effect. Arrays can be installed on building rooftops and are used to provide electricity to the buildings and to the general electrical grid. Photovoltaic modules are often interconnected in such arrays. For example, adjacent modules positioned in the same row are typically connected to each. However, occasionally, adjacent modules are not connected to each other and some other connections are provided at the interface of the two modules.

SUMMARY

Provided are novel Building Integrable Photovoltaic (BIPV) modules having one or more connectors that are movable between extended and retracted positions. Connector adjustment may be performed in the field, for example, during installation of a module. In certain embodiments, a connector includes a connector body and extension body. The extension body flexibly attaches the connector body to the module and allows the connector body to move with respect to the module edge. In an extended position, the connector body is positioned closer to the edge and is configured to make electrical connections to a joiner connector for interconnecting with an adjacent module. In a retracted positioned, the connector body is positioned further from the edge and is configured to make electrical connections to a jumper for interconnecting the conductive elements of the connector. In certain embodiments, a jumper does not protrude beyond the edge when connected to the connector body. Also provided are novel connectors.

In certain embodiments, a BIPV module includes a photovoltaic insert, having a front side and back side, as well as a module connector having a connector body and extension body. The photovoltaic insert includes one or more photovoltaic cells disposed along the front side. The front and back sides form an edge of the photovoltaic insert. The extension body flexibly attaches the connector body to the back side of the photovoltaic insert, allowing the connector body to move along the back side of the photovoltaic insert with respect to the edge between an extended position and a retracted position. The connector body includes two conductive elements, at least one of which is electrically coupled to the one or more photovoltaic cells. In the retracted position, the connector body is configured to attach to a jumper for electrically interconnecting the two conductive elements such. When attached to the connector body, the electrical jumper does not protrude beyond the edge of the photovoltaic insert. The connector body is positioned closer to the edge when it is in the extended positioned than when it is in the retracted position.

In certain embodiments, the connector body is positioned less than about 20 millimeters from the edge when in the extended position. In the same or other embodiments, the connector body moves by between about 3 millimeters and 20 millimeters between the extended and retracted positions. The extension body may form a loop around the connector body when the connector body is in the retracted position. The connector body may be flipped with respect to the back side of the photovoltaic insert when the connector body moves between the retracted and extended positions.

In certain embodiments, the connector body is movable with respect to the back side of the photovoltaic insert in two or more directions and/or around one or more axes. In the same or other embodiments, the connector body is movable with respect to the edge of the photovoltaic insert in at least a direction substantially parallel to the edge.

The connector body may include one or more sockets enclosing the one or more conductive elements. These sockets may be substantially parallel to the back side of the photovoltaic insert in at least the retracted position. In the same or other embodiments, the extension body includes two flexible conductors insulated by a flexible insulating sheath. In these embodiments, the two flexible conductors may be electrically insulated from each other and electrically coupled to the two conductive elements of the connector body. Each of the two flexible conductors may include a flat conductive strip having a width-to-thickness ratio of at least about 10. In the same or other embodiments, the flat conductive strip of the flexible conductor strip has a width of between about 3 millimeters and about 18 millimeters and a thickness of between about 0.1 millimeters and about 0.6 millimeters. The flexible insulating sheath may include a base polymer material coated with a fluorinated polymer material. For example, the polymer material may polyethylene, polypropylene, and/or polyethylene terephthalate.

In certain embodiments, the connector body is configured to interlock with the back side of the photovoltaic insert in at least the extended position. For example, the connector body may be allowed to move within a predetermined range with respect to the edge of the photovoltaic insert while at least in the retracted position to accommodate for thermal expansion. The connector body may include an interlocking mechanism for interlocking with the electrical jumper and/or an electrical joiner. In the same or other embodiments, the back side of the photovoltaic insert includes an interlocking mechanism for interlocking with electrical jumper and/or an electrical joiner. The extension body may include a shaped portion to provide flexible attachment to the connector body.

Provided also is a photovoltaic array including a first BIPV module and second BIPV module. The first BIPV module includes a first module connector having a first connector body, which includes a first cell conductive element and a first bus conductive element. The first module connector also includes a first extension body flexibly attaching the first connector body to the back side of the first building integrable photovoltaic and allowing the connector body to move between an extended position and a retracted position with respect to an edge of the first BIPV module. The first BIPV module also includes a first set of electrically interconnected cells connected to the first cell conductive element and a first bus bar extending through the module and connected to the first bus conductive element.

The second BIPV module includes a second module connector having a second connector body, which includes a second cell conductive element and a second bus conductive element. The second module connector also includes a second extension body flexibly attaching the second connector body to the back side of the second BIPV module. The second BIPV module also includes a second set of electrically interconnected cells connected to the second cell conductive element and a second bus bar extending through the module and connected to the second bus conductive element. The second BIPV module can be positioned in the same row with adjacent to the first BIPV module.

The photovoltaic array can also include a joiner connector connected to and extending between the first connector body provided in the extended position and the second connector body provided in the extended position. The joiner connector interconnects the first cell conductive element and the second cell conductive element and interconnects the first bus conductive element and the second bus conductive element.

Provided also a photovoltaic array including a BIPV module having a module connector. This module connector includes a connector body having a cell conductive element and a bus conductive element. The module connector also includes an extension body flexibly attaching the connector body to the back side of the building integrable photovoltaic allowing the connector body to move between an extended position and a retracted position with respect to an edge of the BIPV module. The BIPV module also includes a set of electrically interconnected cells connected to the cell conductive element. The BIPV module includes a bus bar extending through the module and connected to the bus conductive element. The photovoltaic array includes a jumper attached to the connector body and connecting the cell conductive element with the bus conductive element. The jumper does not extend past the edge of the BIPV module. These and other embodiments are described further below with reference to the figures.

BRIEF DESCRIPTION OF THE DRAWINGS

FIGS. 8A-8C are schematic cross-sectional views of two connectors configured for interconnection with each other, in accordance with certain embodiments.

FIGS. 11A and 11B are two schematic views of an extended module connector, in accordance with certain embodiments.

FIG. 11C is a schematic side view of a retracted connector, in accordance with certain embodiments.

FIG. 11D is a schematic side view of another retracted connector, in accordance with different embodiments.

DETAILED DESCRIPTION OF EXAMPLE EMBODIMENTS

BIPV modules described herein can be arranged into multiple rows on a building structure forming an array of BIPV modules. Each BIPV module is typically connected to one or two adjacent modules, which may be positioned in the same row or adjacent rows. To provide these connections, each module can include two module connectors positioned along opposite edges of the modules. A joiner connector may be used to establish one or more electrical connections between two adjacent modules or, more specifically, between conductive elements of two adjacent module connectors of these modules. Interconnecting conductive elements of the same connector is often referred to as jumping of the connector. A jumper may be used for these purposes. A jumper is a device that can interconnect at least two conductive elements of a single module connector.

The module connectors described herein can be positioned to connect to various types of connectors including joining connectors, jumpers and inverters. The module connectors described herein allow an interface between two modules to accommodate one or more jumpers and/or inverter connections while preserving the pitch between BIPV modules in the array.

In some embodiments, the module connectors are located as close as possible to the module edges to simplify installation and avoid having unnecessary long joiner connectors thereby reducing materials and installation costs. At the same time, a module connector may be used for connecting to a jumper and may be positioned at a certain distance away from the module edge in order to accommodate a jumper. For example, a jumper connected to a module connector may be positioned within the boundaries of the module, such that it does not protrude outside the module edge. In other embodiments, a portion of the jumper may extend outside of the module boundaries. In either case, two jumpers attached to adjacent connectors should not interfere with each other.

BIPV modules described herein have module connectors configured to extend and retract with respect to an edge of the module. The module connectors can be adjusted depending on the type of electrical connection desired. For example, to connect a module connector of a BIPV module to an adjacent BIPV module through a joiner connector, the module connector may be moved into an extended position. To connect a module connector to a jumper, the module connector may be moved to a retracted position. In order to accommodate the jumper and avoid interference with other components.

Figure 1:
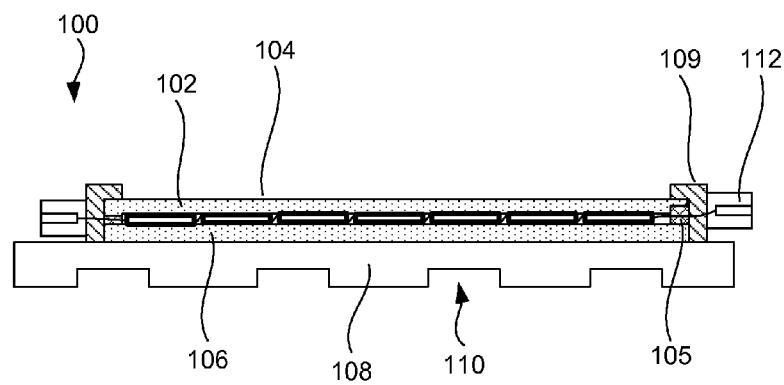
FIG. 1 is a schematic cross-sectional side view of a BIPV module, in accordance with certain embodiments.

To provide a better understanding of various features of BIPV modules and their module connectors, some examples of BIPV modules will now be briefly described. FIG. 1 is a schematic cross-sectional end view (line 1-1 in FIG. 2 indicates the position of this cross-section) of a BIPV module 100, in accordance with certain embodiments. BIPV module 100 may have one or more photovoltaic cells 102 that are electrically interconnected. Photovoltaic cells 102 may be interconnected in parallel, in series, or in various combinations of these. Examples of photovoltaic cells include copper indium gallium selenide (CIGS) cells, cadmium-telluride (Cd—Te) cells, amorphous silicon (a-Si) cells, micro-crystalline silicon cells, crystalline silicon (c-Si) cells, gallium arsenide multi junction cells, light adsorbing dye cells, organic polymer cells, and other types of photovoltaic cells.

Photovoltaic cell 102 has a photovoltaic layer that generates a voltage when exposed to sunlight. In certain embodiments, the photovoltaic layer includes a semiconductor junction. The photovoltaic layer may be positioned adjacent to a back conductive layer, which, in certain embodiments, is a thin layer of molybdenum, niobium, copper, and/or silver. Photovoltaic cell 102 may also include a conductive substrate, such as stainless steel foil, titanium foil, copper foil, aluminum foil, or beryllium foil. Another example includes a conductive oxide or metallic deposition over a polymer film, such as polyimide. In certain embodiments, a substrate has a thickness of between about 2 mils and 50 mils (e.g., about 10 mils), with other thicknesses also in the scope. Photovoltaic cell 102 may also include a top conductive layer. This layer typically includes one or more transparent conductive oxides (TCO), such as zinc oxide, aluminum-doped zinc oxide (AZO), indium tin oxide (ITO), and gallium doped zinc oxide. A typical thickness of a top conductive layer is between about 100 nanometers to 1,000 nanometers (for example, between about 200 nanometers and 800 nanometers), with other thicknesses within the scope.

In certain embodiments, photovoltaic cells 102 are interconnected using one or more current collectors (not shown). The current collector may be attached and configured to collect electrical currents from the top conductive layer. The current collector may also provide electrical connections to adjacent cells as further described with reference to of FIG. 5, below. The current collector includes a conductive component (e.g., an electrical trace or wire) that contacts the top conductive layer (e.g., a TCO layer). The current collector may further include a top carrier film and/or a bottom carrier film, which may be made from transparent insulating materials to prevent electrical shorts with other elements of the cell and/or module. In certain embodiments, a bus bar is attached directly to the substrate of a photovoltaic cell. A bus bar may also be attached directly to the conductive component of the current collector. For example, a set of photovoltaic cells may be electrically interconnected in series with multiple current collectors (or other interconnecting wires). One bus bar may be connected to a substrate of a cell at one end of this set, while another bus bar may be connected to a current collector at another end.

Photovoltaic cells 102 may be electrically and environmentally insulated between a front sheet 104 (i.e., the light incident sheet) and a back sheet 106 (i.e., the building structure facing sheet), which may be referred to as sealing sheets. Examples of such sheets include glass, polyethylene, polyethylene terephthalate (PET), polypropylene, polybutylene, polybutylene terephthalate (PBT), polyphenylene oxide (PPO), polyphenylene sulfide (PPS) polystyrene, polycarbonates (PC), ethylene-vinyl acetate (EVA), fluoropolymers (e.g., polyvinyl fluoride (PVF), polyvinylidene fluoride (PVDF), ethylene-terafluoethylene (ETFE), fluorinated ethylene-propylene (FEP), perfluoroalkoxy (PFA) and polychlorotrifluoroethylene (PCTFE)), acrylics (e.g., poly(methyl methacrylate)), silicones (e.g., silicone polyesters), and/or polyvinyl chloride (PVC), as well as multilayer laminates and co-extrusions of these materials. A typical thickness of a sealing sheet is between about 5 mils and 100 mils or, more specifically, between about 10 mils and 50 mils. In certain embodiments, a back sheet includes a metallized layer to improve water permeability characteristics of the sheet. For example, a metal foil may be positioned in between two insulating layers to form a composite back sheet. In certain embodiments, a module has an encapsulant layer positioned between one or both sheets 104, 106 and photovoltaic cells 102. Examples of encapsulant layer materials include non-olefin thermoplastic polymers or thermal polymer olefin (TPO), such as polyethylene (e.g., a linear low density polyethylene), polypropylene, polybutylene, polyethylene terephthalate (PET), polybutylene terephthalate (PBT), polystyrene, polycarbonates, fluoropolymers, acrylics, ionomers, silicones, and combinations thereof BIPV module 100 may also include an edge seal 105 that surrounds photovoltaic cells 102. Edge seal 105 may be used to secure front sheet 104 to back sheet 106 and/or to prevent moisture from penetrating in between these two sheets. Edge seal 105 may be made from certain organic or inorganic materials that have low inherent water vapor transmission rates (WVTR) (e.g., typically less than 1-2 $g/m^2/day$). In certain embodiments, edge seal 105 is configured to absorb moisture from inside the module in addition to preventing moisture ingression into the module. For example, a butyl-rubber containing moisture getter or desiccant may be added to edge seal 105. In certain embodiments, a portion of edge seal 105 that contacts electrical components (e.g., bus bars) of BIPV module 100 is made from a thermally resistant polymeric material. Various examples of thermally resistant materials and RTI ratings are further described below.

BIPV module 100 may also have a support sheet 108 attached to back sheet 106. The attachment may be provided by a support edge 109, which, in certain embodiments, is a part of support sheet 108. Support sheets may be made, for example, from rigid polymer materials such as polyethylene terephthalate (e.g., RYNITE® available from Du Pont in Wilmington, Del.), polybutylene terephthalate (e.g., CRASTIN® also available from Du Pont), polyphenylene sulfide (e.g., RYTON® available from Chevron Phillips in The Woodlands, Tex.), polyamide (e.g., ZYTEL® available from DuPont), polycarbonate, and polypropylene. In other embodiments, support sheet 108 may be attached to back sheet 106 without a separate support edge 109 or other separate supporting element. For example, support sheet 108 and back sheet 106 may be laminated together, or support sheet 108 may be formed (e.g., by injection molding) over back sheet 106. In other embodiments, back sheet 106 serves as a support sheet 108. In this case, the same element used to seal photovoltaic cells 102 may be positioned over and contact a roof structure (not shown). Support sheet 108 may have one or more ventilation channels 110 to allow for air to flow between BIPV module 100 and a building surface (e.g., a roof-deck or a water resistant underlayment/membrane on top of the roof deck). Ventilation channels 110 may be used for cooling MTV module 100 during its operation. For example, it has been found that each 1° C. of heating from an optimal operating temperature of a typical Copper indium gallium (di)selenide CIGS cell causes an efficiency loss of about 0.33% to 0.5%.

Figure 2:
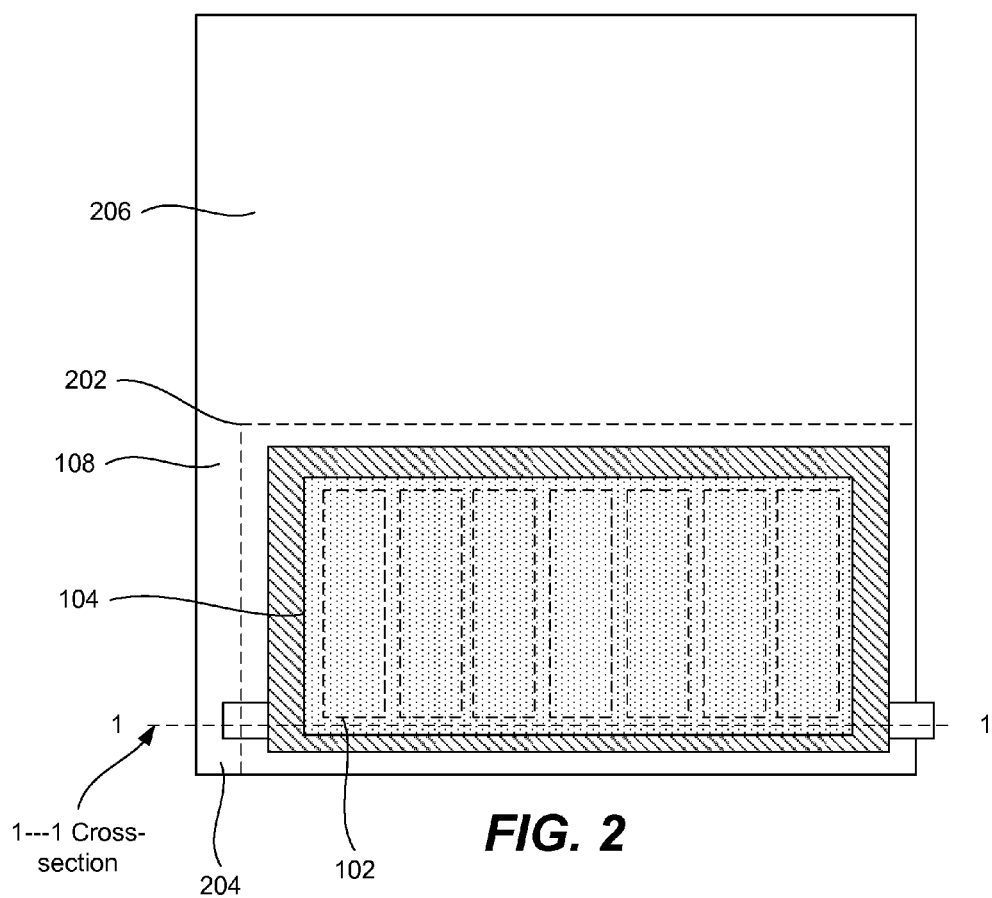
FIG. 2 is a schematic top view of a BIPV module, in accordance with certain embodiments.

BIPV module 100 has one or more electrical connectors 112 for electrically connecting BIPV module 100 to other BIPV modules and array components, such as an inverter and/or a battery pack. In certain embodiments, BIPV module 100 has two electrical connectors 112 positioned on opposite sides (e.g., the short or minor sides of a rectangular module) of BIPV module 100, as shown in FIGS. 1 and 2, for example. However, connectors may also be positioned on other sides as well (e.g., the long or major sides of a rectangular module). Connector position may depend on the overall arrangement of the module and/or installation and repair requirements. Each one of two electrical connectors 112 has at least one conductive element electrically connected to photovoltaic cells 102. In certain embodiments, electrical connectors 112 have additional conductive elements, which may or may not be directly connected to photovoltaic cells 102. For example, each of two electrical connectors 112 may have two conductive elements, one of which is electrically connected to photovoltaic cells 102, while the other is electrically connected to a bus bar (not shown) passing through BIPV module 100. This and other examples are described in more detail in the context of FIGS. 6 and 7. In general, regardless of the number of connectors 112 attached to BIPV module 100, at least two conductive elements of these connectors 112 are electrically connected to photovoltaic cells 102.

FIG. 2 is a schematic top view of BIPV module 100, in accordance with certain embodiments. Support sheet 108 is shown to have a side skirt 204 and a flap portion 206 extending beyond a photovoltaic portion 202 of BIPV module 100. Side skirt 204 is sometimes referred to as a side flap, while flap portion 206 is sometimes referred to as a top lap or a moisture flap. In certain embodiments, BIPV module 100 does not include side skirt 204. Photovoltaic portion 202 is defined as an area of BIPV module 100 that does not extend under other BIPV modules or similar building materials (e.g., roofing shingles) after installation. Photovoltaic portion 202 includes photovoltaic cells 102. Generally, it is desirable to maximize the ratio of the exposed area of photovoltaic cells 102 to photovoltaic portion 202 in order to maximize the "working area" of BIPV module 100. It should be noted that, after installation, flaps of other BIPV modules typically extend under photovoltaic portion 202. In a similar manner, after installation, side skirt 204 of BIPV module 100 may extend underneath another BIPV module positioned on the left (in the same row) of BIPV module 100, thereby creating an overlap for moisture sealing. Flap portion 206 may extend underneath one or more BIPV modules positioned above BIPV module 100. Arrangements of BIPV modules in an array will now be described in more detail with reference to FIGS. 3 and 4.

Figure 3:
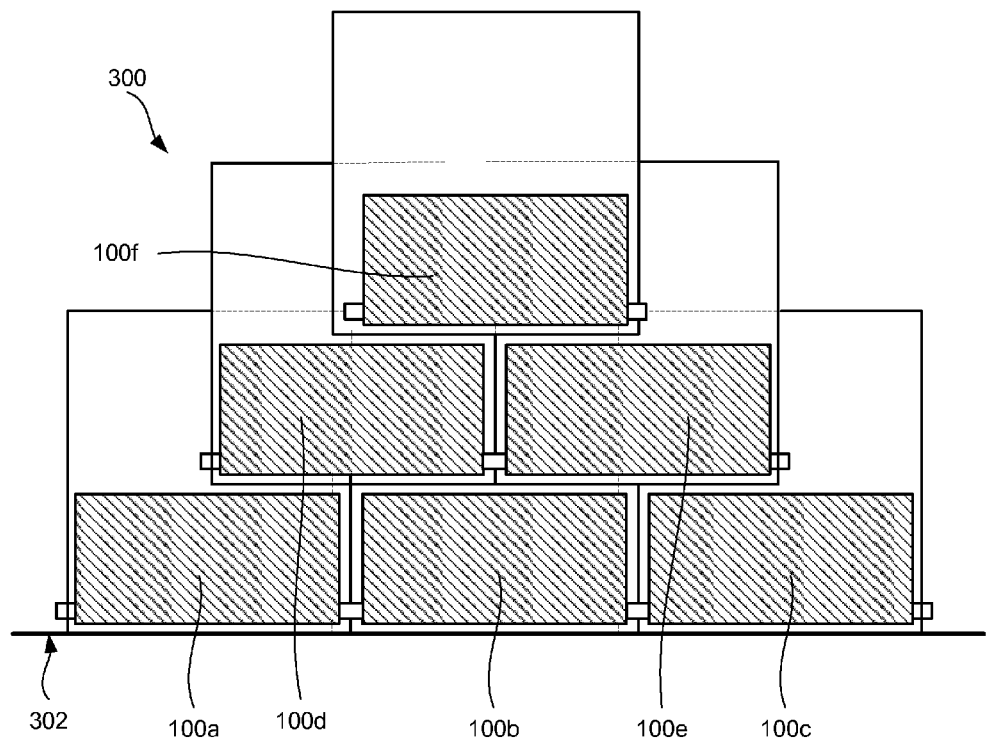
FIG. 3 illustrates a subset of a photovoltaic array that includes six BIPV modules, in accordance with certain embodiments.

FIG. 3 illustrates a photovoltaic array 300 or, more specifically, a portion of a photovoltaic array, which includes six BIPV modules 100a-100f arranged in three different rows extending along horizontal rooflines, in accordance with certain embodiments. Installation of BIPV modules 100a-100f generally starts from a bottom roofline 302 so that the top flaps of BIPV modules 100a-100f can be overlapped with another row of BIPV modules. If a side flap is used, then the position of the side flap (i.e., a left flap or a right flap) determines which bottom corner should be the starting corner for the installation of the array. For example, if a BIPV module has a top flap and a right-side flap, then installation may start from the bottom left corner of the roof or of the photovoltaic array. Another BIPV module installed later in the same row and on the right of the initial BIPV module will overlap the side flap of the initial BIPV module. Furthermore, one or more BIPV modules installed in a row above will overlap the top flap of the initial BIPV module. This overlap of a BIPV module with a flap of another BIPV module creates a moisture barrier.

Figure 4:
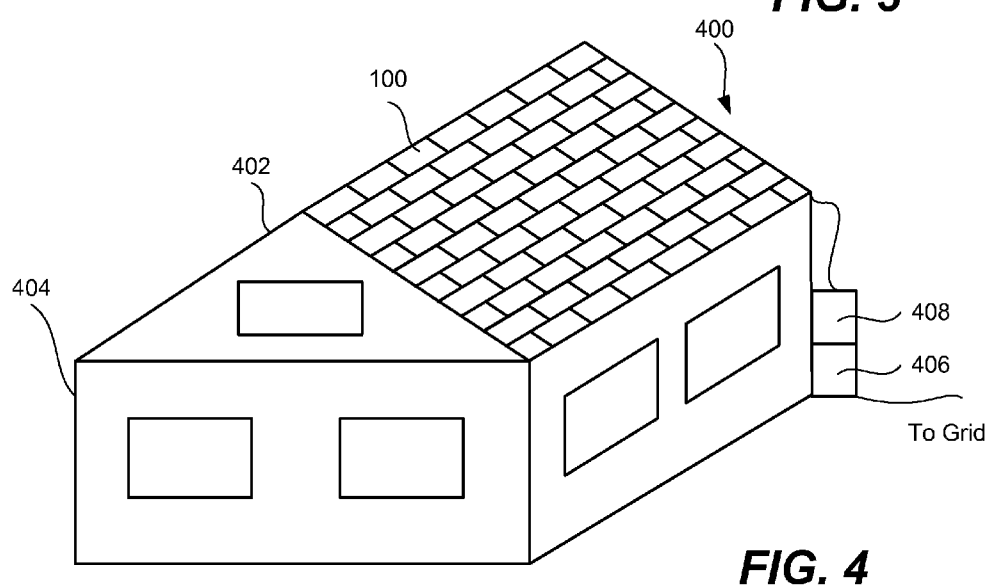
FIG. 4 is a schematic illustration of a photovoltaic array installed on a rooftop of a building structure, in accordance with certain embodiments.

FIG. 4 is a schematic illustration of a photovoltaic array 400 installed on a rooftop 402 of a building structure 404 for protecting building structure 404 from the environment as well as producing electricity, in accordance with certain embodiments. Multiple BIPV modules 100 are shown to fully cover one side of rooftop 402 (e.g., a south side or the side that receives the most sun). In other embodiments, multiple sides of rooftop 402 are used for a photovoltaic array. Furthermore, some portions of rooftop 402 may be covered with conventional roofing materials (e.g., asphalt shingles). As such, BIPV modules 100 may also be used in combination with other roofing materials (e.g., asphalt shingles) and cover only a portion of rooftop. Generally, BIPV modules 100 may be used on steep sloped to low slope rooftops. For example, the rooftops may have a slope of at least about 2.5-to-12 or, in many embodiments, at least about 3-to-12.

Multiple BIPV modules 100 may be interconnected in series and/or in parallel with each other. For example, photovoltaic array 400 may have sets of BIPV modules 100 interconnected in series with each other (i.e., electrical connections among multiple photovoltaic modules within one set), while these sets are interconnected in parallel with each other (i.e., electrical connections among multiple sets in one array). Photovoltaic array 400 may be used to supply electricity to building structure 404 and/or to an electrical grid. In certain embodiments, photovoltaic array 400 includes an inverter 406 and/or a battery pack 408. Inverter 406 is used for converting a direct current (DC) generated by BIPV modules 100 into an alternating current (AC). Inverter 406 may be also configured to adjust a voltage provided by BIPV modules 100 or sets of BIPV modules 100 to a level that can be utilized by building structure 404 or by a power grid. In certain embodiments, inverter 406 is rated up to 600 volts DC input or even up to 1000 volts DC, and/or up to 10 kW power. Examples of inverters include a photovoltaic static inverter (e.g., BWT10240-Gridtec 10, available from Trace Technologies in Livermore, Calif.) and a string inverter (e.g. Sunny Boy®2500 available from SMA America in Grass Valley, Calif.). In certain embodiments, BIPV modules 100 may include integrated inverters (i.e., "on module" inverters). These inverters may be used in addition to or instead of external inverters. Battery pack 408 is used to balance electric power output and consumption.

Figure 5:
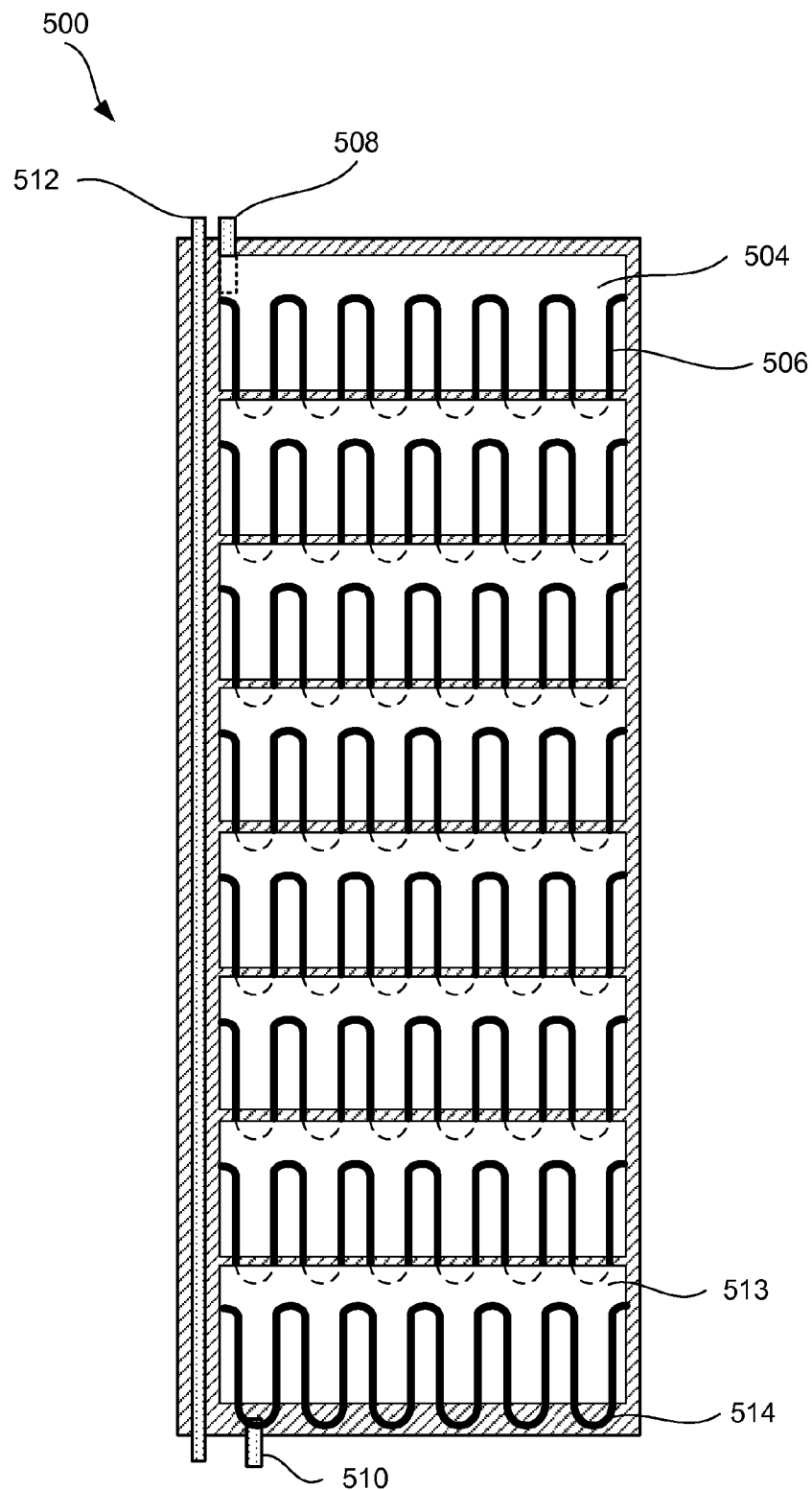
FIG. 5 is a schematic representation of a photovoltaic module having electrically interconnected photovoltaic cells, in accordance with certain embodiments.

FIG. 5 is a schematic representation of a photovoltaic module insert 500 illustrating photovoltaic cells 504 electrically interconnected in series using interconnecting wires 506, in accordance with certain embodiments. Often individual cells 504 do not provide an adequate output voltage. For example, a typical voltage output of an individual CIGS cell is only between 0.4V and 0.7V. To increase voltage output, photovoltaic cells 504 may be electrically interconnected in series (for example, as shown in FIG. 5) and/or include "on module" inverters (not shown). Interconnecting wires 506 may also be used to provide uniform current distribution and collection from one or both contact layers.

As shown in FIG. 5, each pair of photovoltaic cells 504 has one interconnecting wire positioned in between the two cells and extending over a front side of one cell and over a back side of the adjacent cell. For example, a top interconnecting wire 506 in FIG. 5 extends over the front light-incident side of cell 504 and under the back side of the adjacent cell. In the figure, the interconnecting wires 506 also collect current from the TCO layer and provide uniform current distribution, and may be referred to herein as current collectors. In other embodiments, separate components are used for current collection and cell-to-cell interconnection. End cell 513 has a current collector 514 that is positioned over the light incident side of cell 513 but does not connect to another cell. Current collector 514 connects cell 513 to a bus bar 510. Another bus bar 508 may be connected directly to the substrate of the cell 504 (i.e., the back side of cell 504). In another embodiment, a bus bar may be welded to a wire or other component underlying the substrate. In the configuration shown in FIG. 5, a voltage between bus bars 508 and 510 equals a sum of all cell voltages in insert 500. Another bus bar 512 passes through insert 500 without making direct electrical connections to any photovoltaic cells 504. This bus bar 512 may be used for electrically interconnecting this insert in series without other inserts, as further described below with reference to FIG. 6. Similar current collectors/interconnecting wires may be used to interconnect individual cells or set of cells in parallel (not shown).

Figure 6:
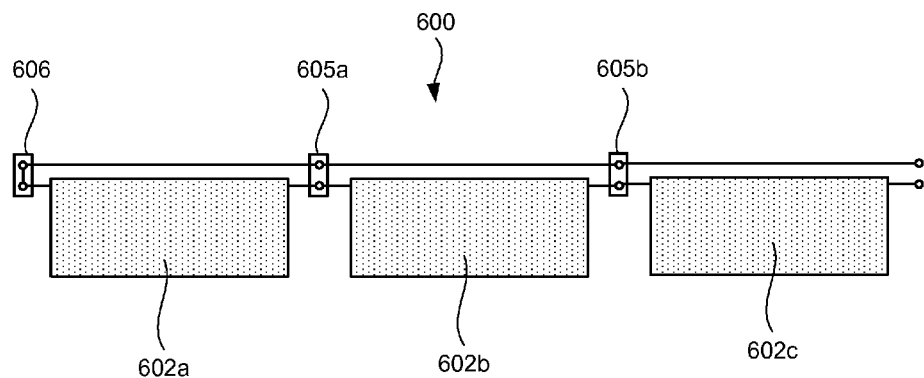
FIG. 6 is a schematic electrical diagram of a photovoltaic array having three BIPV modules interconnected in series, in accordance with certain embodiments.

BIPV modules themselves may be interconnected in series to increase a voltage of a subset of modules or even an entire array. FIG. 6 illustrates a schematic electrical diagram of a photovoltaic array 600 having three BIPV modules 602a-602c interconnected in series using module connectors 605a, 605b, and 606, in accordance with certain embodiments. A voltage output of this three-module array 600 is a sum of the voltage outputs of the three modules 602a-602c. Each module connector 605a and 605b shown in FIG. 6 may be a combination of two module connectors of BIPV modules 602a-602c. These embodiments are further described with reference to FIGS. 8A-8C. In other words, there may be no separate components electrically interconnecting two adjacent BIPV modules, with the connection instead established by engaging two connectors installed on the two respective modules. In other embodiments, separate connector components (i.e., not integrated into or installed on BIPV modules) may be used for connecting module connectors of two adjacent modules.

Module connector 606 may be a special separate connector component that is connected to one module only. It may be used to electrically interconnect two or more conductive elements of the same module connector (e.g., to close an electrical loop in a series of connections).

Figure 7:
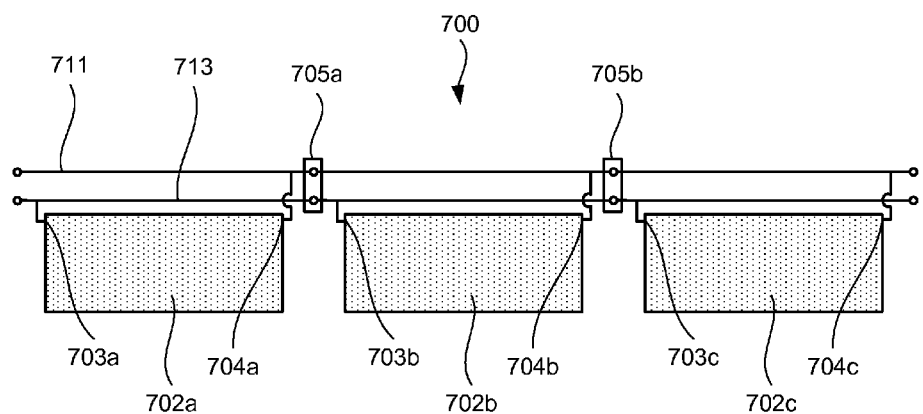
FIG. 7 is a schematic electrical diagram of a photovoltaic array having three BIPV modules interconnected in parallel, in accordance with other embodiments.

Sometimes BIPV modules may need to be electrically interconnected in parallel. FIG. 7 illustrates a schematic electrical diagram of a photovoltaic array 700 having three BIPV modules 702a-702c interconnected in parallel using module connectors 705a and 705b, in accordance with certain embodiments. Each module may have two bus bars extending through the module (i.e., a "top" bus bar 711 and a "bottom" bus bar 713, as shown in FIG. 7). Top bus bars 711 of each module are connected to right electrical leads 704a, 704b, and 704c of the modules, while bottom bus bars 713 are connected to left electrical leads 703a, 703b, and 703c. A voltage between the top bus bars 711 and bottom bus bars 713 is therefore the same along the entire row of BIPV modules 702a-702c.

FIG. 8A is a schematic cross-sectional side view of two connectors 800 and 815 configured for interconnection with each other, in accordance with certain embodiments. For simplicity, the two connectors are referred to as a female connector 800 and a male connector 815. Each of the two connectors 800 and 815 is shown attached to its own photovoltaic insert, which includes photovoltaic cells 802 and one or more sheets 804. Connectors 800 and 815 include conductive elements 808b and 818b, respectively, which are shown to be electrically connected to photovoltaic cells 802 using bus bars 806 and 816, respectively.

In certain embodiments, a conductive element of one connector (e.g., conductive element 808b of female connector 800) is shaped like a socket/cavity and configured for receiving and tight fitting a corresponding conductive element of another connector (e.g., conductive element 818b of male connector 815). Specifically, conductive element 808b is shown forming a cavity 809b. This tight fitting and contact in turn establishes an electrical connection between the two conductive elements 808b and 818b. Accordingly, conductive element 818b of male connector 815 may be shaped like a pin (e.g., a round pin or a flat rectangular pin). A socket and/or a pin may have protrusions (not shown) extending towards each other (e.g., spring loaded tabs) to further minimize the electrical contact resistance by increasing the overall contact area. In addition, the contacts may be fluted to increase the likelihood of good electrical contact at multiple points (e.g., the flutes guarantee at least as many hot spot asperities of current flow as there are flutes).

In certain embodiments, connectors do not have a cavity-pin design as shown in FIGS. 8A-8C. Instead, an electrical connection may be established when two substantially flat surfaces contact each other. Conductive elements may be substantially flat or have some topography designed to increase a contact surface over the same projection boundary and/or to increase contact force at least in some areas. Examples of such surface topography features include multiple pin-type or rib-type elevations or recesses.

In certain embodiments, one or more connectors attached to a BIPV module have a "touch free" design, which means that an installer cannot accidently touch conductive elements or any other electrical elements of these connectors during handling of the BIPV module. For example, conductive elements may be positioned inside relatively narrow cavities. The openings of these cavities are too small for a finger to accidently come in to contact with the conductive elements inside the cavities. One such example is shown in FIG. 8A where male connector 815 has a cavity 819b formed by connector body 820 around its conductive pin 818b. While cavity 819b may be sufficiently small to ensure a "touch free" designed as explained above, it is still large enough to accommodate a portion of connector body 810 of female connector 800. In certain embodiments, connector bodies 810 and 820 have interlocking features (not shown) that are configured to keep the two connectors 800 and 815 connected and prevent connector body 810 from sliding outs of cavity 819b. Examples of interlocking features include latches, threads, and various recess-protrusion combinations.

FIG. 8B is schematic plan view of female connector 800 and male connector 815, in accordance with certain embodiments. Each of the connectors 800 and 815 is shown with two conductive elements, i.e., conductive elements 808a and 808b formed as sockets in connector 800 and conductive elements 818a and 818b formed as pins in connector 815. One conductive element of each connector is shown to be electrically connected to photovoltaic cells 802. Another conductive element of each of the two connectors 800 and 815 may be connected to bus bars (e.g., bus bars 809 and 819) that do not have an immediate electrical connection to photovoltaic cells 802 of their respective BIPV module (the extended electrical connection may exist by virtue of a complete electrical circuit).

As shown, conductive elements 808a and 808b may have their own designated inner seals 812a and 812b. Inner seals 812a and 812b are designed to provide more immediate protection to conductive elements 808a and 818a after connecting the two connectors 800, 815. As such, inner seals 812a and 812b are positioned near inner cavities of conductive elements 808a and 808b. The profile and dimensions of pins 818a and 818b closely correspond to that of inner seals 812a and 812b. In the same or other embodiments, connectors 800, 815 have external seals 822a and 822b. External seals 822a and 822b may be used in addition to or instead of inner seals 812a and 812b. Various examples of seal materials and fabrication methods are described below in the context of FIG. 9. FIG. 8C is schematic front view of female connector 800 and male connector 815, in accordance with certain embodiments. Connector pins 818a and 818b are shown to have round profiles. However, other profiles (e.g., square, rectangular) may also be used for pins 818a and 818b and conductive elements 808a and 808b.

Figure 9A:
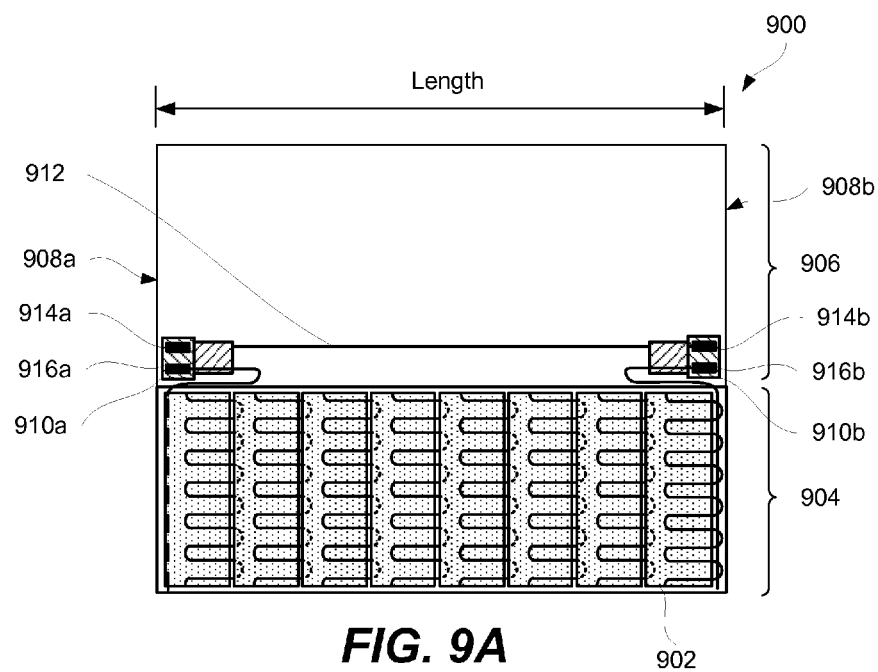
FIG. 9A is a schematic view of a BIPV module illustrating various electrical connections provided within the module, in accordance with certain embodiments.

A brief description of BIPV modules and photovoltaic arrays including multiple strings is presented below to provide a better understanding of the novel module connectors described herein and BIPV modules having such connectors. FIG. 9A is a schematic illustration of a BIPV module 900, in accordance with certain embodiments. Module 900 includes one or more photovoltaic cells 902. When multiple cells are used, these cells may be interconnected in series to increase voltage output of the module. Photovoltaic cells 902 may be integrated into a photovoltaic insert that provides mechanical integration of various module components, such as moisture flap and module connectors. In general, the photovoltaic insert may include a photovoltaic portion 904 having photovoltaic cells and a moisture flap portion 906 for extending under one or more adjacent modules and sealing the underlying building structure from the environment.

FIG. 9A shows module 900 having two module connectors 910a and 910b positioned along edges 908a and 908b of the module. Edges 908a and 908b define the length of module 900 and may form interfaces with adjacent BIPV modules positioned in the same row. Module connectors 910a and 910b may be positioned at any allocation along these edges, such as within photovoltaic portion 904, within moisture flap portion 906, or at the interface of these two portions. These connectors may extend outside of the module boundaries, may be positioned flush with edges 908a and 908b, or within the module boundaries and away from the edges. Connectors 910a and 910b may be positioned on the back side of the module such that module 900 provides environmental protection to connectors 910a and 910b. However, in certain embodiments, connectors may be positioned on the front side of a module, such as on the moisture flap portion. In these embodiments, the connectors may be covered during installation by other modules to provide environmental protection.

Each one of module connectors 910a and 910b may include two conductive elements. Specifically, module connector 910a is shown to have conductive element 914a connected to bus bar 912 and conductive element 916a connected to photovoltaic cells 902. Module connector 910b is shown to have conductive element 914b connected to bus bar 912 and conductive element 916b connected to photovoltaic cells 902. Bus bar 912 is typically used to provide a return path to a photovoltaic string, to which this module belongs. The string is formed when multiple modules are electrically connected in series with each other as further explained below with reference to FIG. 9B. As such, bus bar 912 interconnects a pair of conductive elements 914a and 914b of connectors 910a and 910b, while another pair of conductive elements 916a and 916b is connected to photovoltaic cells 902

Multiple BIPV modules may be interconnected in series forming a string to increase an overall operating voltage. Operating voltages of individual modules, which typically range between 5V and 50V are often insufficient for effective use of other array components, such as conducting lines and inverters. A number of interconnected BIPV modules in a string may be limited by local regulations, such building and electrical codes, inverter ratings, and other factors.

Figure 9B:
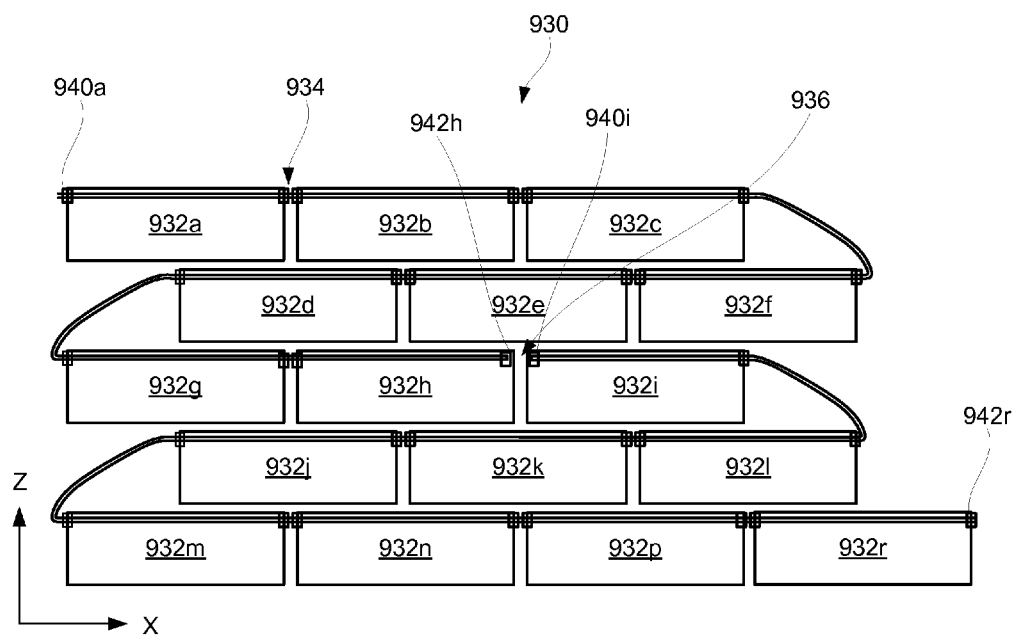
FIG. 9B is a schematic view of a BIPV array having two strings, in accordance with certain embodiments.

FIG. 9B illustrates an example of a photovoltaic array 930 including two strings, in accordance with certain embodiments. Each string may include modules positioned in multiple rows. Specifically, one string shown in FIG. 9B includes modules 932a-932h that occupy the top two rows and a portion of the middle row. Another string shown in FIG. 9B includes modules 932i-932r that occupy the bottom two rows and the remaining portion of the middle row. For simplicity, photovoltaic and flap portions of the modules as well individual cells of the modules are not shown in FIG. 9B. The modules shown in FIG. 9B may correspond to the one shown in FIG. 9A.

Each string has two ends represented by end module connectors of end modules. One end of the string is connected to an inverter or some other electrical component of the array, while another end may be jumped. For example, left connector 940a of module 932a and right connector 942r of module 932r may be connected to an inverter in the example presented in FIG. 9B. The same example also shows right connector 942h of module 932h and left connector 940i of module 932i jumped. Otherwise, every other module in each of these strings is connected to its two adjacent modules, which may be positioned in the same row or adjacent rows.

End module connectors may be positioned at the end of a row, such as left connector 940a of module 932a and right connector 942r of module 932r. Alternatively, end module connectors may be positioned anywhere within a row and adjacent to another module, such as right connector 942h of module 932h and left connector 940i of module 932i. When an end module connector is positioned within a row, it is usually adjacent to another similar connector. As described above, such end module connectors can be jumped (as shown in FIG. 9B) or connected to their respective inverters. In some embodiments, one end module connector may be jumped, while another may be connected to an inverter. Regardless of these connection schemes, an interface area 936 between two end module connectors positioned within a row (between right connector 942h of module 932h and left connector 940i of module 932i in the example shown in FIG. 9B) accommodates two separate connections and respective components, such as two jumpers. Other interface areas 934, which do not correspond to string ends, each accommodate only one joiner connector.

To preserve sealing and aesthetic characteristics of an array, all modules are aligned such that the spacing or overlap between any two adjacent modules in a row is the same. Interface areas 934 and 936 have substantially the same spacing. Interface areas 934 accommodate only joiner connectors, and at the same time, interface area 936 accommodates two separate connections, for example, two separate jumpers.

BIPV modules described herein include module connectors that can change their positions with respect to their module edges depending on installation and connection requirements. Specifically, a module connector includes a movable connector body and flexible extension body. The extension body flexibly attaches the connector body to the photovoltaic insert. This attachment allows moving the connector body closer to or further away from the module edge. For example, the connector body may move between two positions: an extended position, in which the connector body is closer to the module edge, and a retracted position, in which the connector body is further away from the edge. In the extended position, the connector body may be configured to make an electrical connection to another connector body of an adjacent module using, for example, a joiner connector. In the retracted position, the connector body may be configured to be jumped by, for example, attaching a jumper to the connector body. The connector body may also make an electrical connection to an inverter connector while in the retracted position. The retracted position may be also referred to as an enclosed position or a flush mounted position. A flush mounted jumper or inverter connector allows two different strings or, more specifically, two end modules of different strings to abut in a single row without any interruption in that row.

Figure 10A:
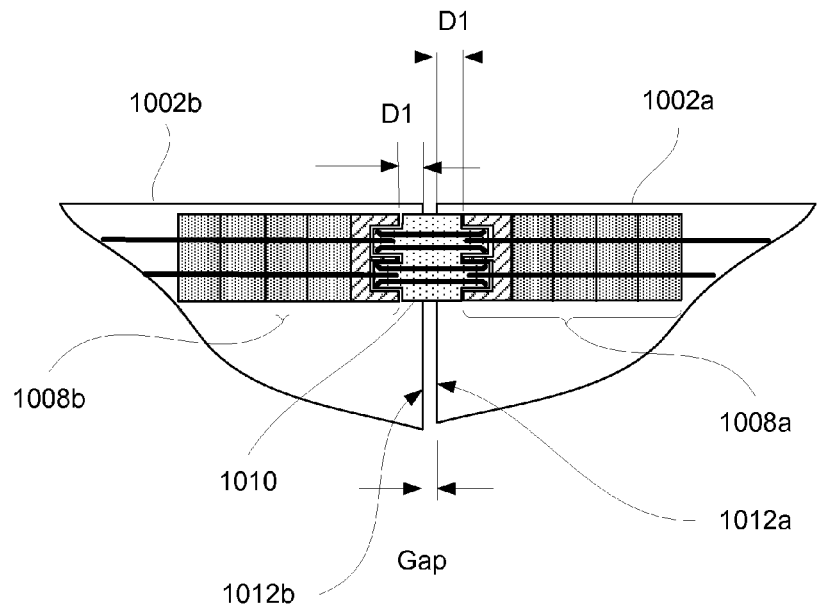
FIG. 10A is a schematic view of two extended module connectors interconnected using a joiner connector, in accordance with certain embodiments.

Moving the connector body between extended and retracted positions will now be explained in more detail with reference to FIGS. 10A and 10B. Specifically, FIG. 10A illustrates portions of BIPV modules 1002a and 1002b with their connectors 1008a and 1008b in extended positions, in accordance with certain embodiments. Each connector is positioned at a D1 distance from its corresponding module edge, i.e., connector 1008a with respect to edge 1012a and connector 1008b with respect to edge 1012b. These distances between the connectors and edges may be sufficiently small such that a combination of these distances and any gap between the modules accommodates a joiner connector 1010 positioned in between and electrically connecting connectors 1008a and 1008b. The D1 distance does not exceed a certain predetermined value in order to establish and maintain these electrical connections. In certain embodiments, the D1 distance is up to about 20 millimeters or, more specifically, between 5 millimeters and 15 millimeters. In the same or other embodiments, the gap between the edges of two adjacent modules is between about 1 millimeter and 12 millimeters or, more specifically, between 2 millimeters and 6 millimeters. Any gap between two adjacent modules can be sealed by a moisture flap of another module positioned in an adjacent row (e.g., lower row) and extending underneath these two modules to overlap with the gap.

Figure 10B:
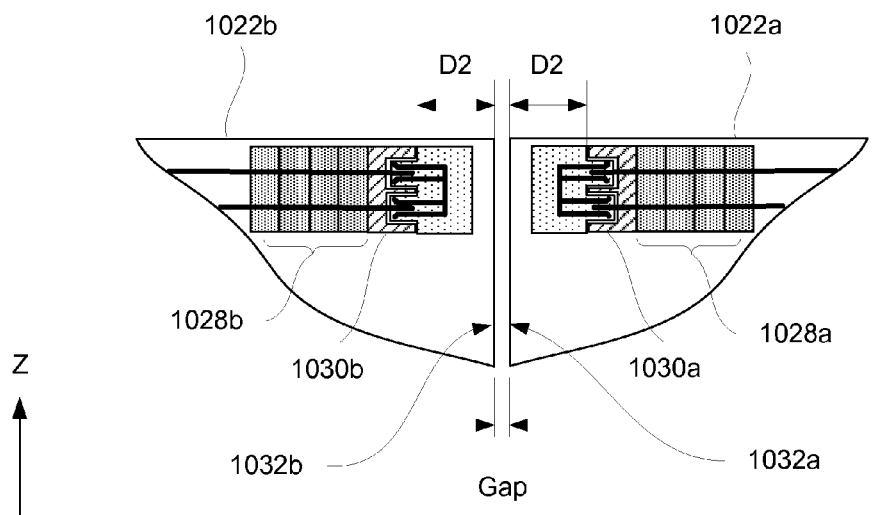
FIG. 10B is a schematic view of two retracted module connectors that are individually jumped, in accordance with certain embodiments.

FIG. 10B illustrates portions of BIPV modules 1022a and 1022b with their connectors 1028a and 1028b in retracted positions, in accordance with certain embodiments. BIPV modules 1022a and 1022b may correspond to modules 1002a and 1002b shown in FIG. 10A with their connectors moved into the new position. Specifically, retracted connectors 1028a and 1028b are each positioned at a distance D2 from their corresponding module edges 1032a and 1032b. The D2 distance is greater than the D1 distance by between about between about 15 millimeters and 50 millimeters or, more specifically, between 20 millimeters and 30 millimeters. This difference defines the offset between the extended and retracted positions and, in certain embodiments, is between about 3 millimeters and 20 millimeters, for example, between about 5 millimeters and 7 millimeters for snap connectors and about 15 millimeters for other types of connectors.

The D2 distance may be sufficient to accommodate a jumper or an inverter connection by itself or in combination with a portion of the gap between the modules. In specific embodiments, jumpers do not extend beyond the corresponding module edges. Overall, the distance between the retracted connector and module edge can be between about 10 millimeters and 50 millimeters or, more specifically, between 15 millimeters and 30 millimeters.

Extended and retracted positions of module connectors may be adjusted in the field. For example, an installer may first determine if a module connector corresponds to the end of a string and then change position of the connector. In certain embodiments, modules may be fabricated with their module connectors in the extended position. In certain embodiments, at least portion of the module connector, such as a connector body, is movable with respect to the insert in two or more directions and/or around one or more axes, for example, around the X and/or Y directions as shown in 10B. Allowing the connector body to move in the Y direction, which is parallel to edges 1032a and 1032b, may help to accommodate some misalignment between adjacent modules, which may be between about 0.5 millimeters and 3.5 millimeters. Furthermore, a portion of a module connector, such as a connector body, may have some flexibility in its retracted and extended positions to allow for thermal expansion fluctuations during operation of the array. For example, a gap variation between two adjacent modules (caused by thermal expansion-contraction of these modules and building structure as well as other factors) may be between about 0.25 millimeters and 10 millimeters. Some areas of BIPV modules, such as connector portions of the edge, may expand less, while other areas, such as flap portions of the edge, may expand more. Modeling of BIPV modules indicates that glass sealing sheets may help to reduce this thermally driven variation. Therefore, photovoltaic portions of glass-type BIPV modules may distort less, while flap portions may flare and have substantial variations. When flexible sealing sheets are used, distortion and resulting gap variation are expected to be greater even in the photovoltaic portion. Mechanical fasteners may help, to a certain degree, to restrain some nearby portions of BIPV modules. As such, mechanical fasteners may be positioned adjacent to module connectors, for example, during installation of the modules.

FIGS. 11A and 11B illustrate top and cross-sectional side schematic views of a portion of BIPV module 1100 having an extended connector 1110, in accordance with certain embodiments. Similar to FIG. 10A, the extended position of connector 1110 is defined by the D1 distance, which in this example is a distance between edge 1104 of module 1100 and connector 1110. Module 1100 includes a photovoltaic insert 1102 having a front side 1103 and a back side 1105 and one or more photovoltaic cells 1106 disposed along front side 1103. For example, photovoltaic cells 1106 may be positioned under a sealing sheet forming front side 1103 of photovoltaic insert 1102. In certain embodiments, photovoltaic cells may extend over one or both connectors of a BIPV module.

Connector 1110 includes a connector body 1114 and extension body 1112. Extension body 1112 flexibly attaches connector body 1114 to the back side 1105 of insert 1102 and allows connector body 1114 to move along the back side 1105 with respect to edge 1104. In certain embodiments, photovoltaic insert 1102 includes a cavity 1108, a surface of which can be apart of back side 1105. Cavity 1108 may house connector 1110 such that connector 1110 does not protrude beyond the boundaries of cavity 1108.

Extension body 1112 may have one of its ends attached to photovoltaic insert 1102, for example, to back side 1105 of photovoltaic insert 1102. Another end of extension body 1112 is attached to connector body 1114. Extension body 1112 includes a flexible portion provided in between these two ends that allows connector body 1114 to move with respect to photovoltaic insert 1102.

FIG. 11C illustrates aside cross-sectional schematic view of a portion of BIPV module 1120 having a retracted connector 1121, in accordance with certain embodiments. This retracted connector is set at the D2 distance from edge 1126. Extension body 1122 may be bent or folded to allow connector body 1124 to move into the photovoltaic insert away from edge 1126. Extension body 1122, or a flexible portion thereof may have, multiple shaped bends or folds. In some other embodiments, flexibility of the flexible portion exists due to flexibility of materials, such as stranded wire or materials having low cross-sectional aspect ratios.

FIG. 11D illustrates a side cross-sectional schematic view of a portion of BIPV module 1130 having a retracted connector 1131, in accordance with other embodiments. The orientation of connector body 1134 of connector 1130 is changed with respect the X axis, as compared to the example of FIGS. 11A and 11B. Specifically, connector body 1134 is flipped in the X direction with respect to other components of BIPV module 1130 when connector body 1134 moves between the retracted position and the extended position. Side 1136 of connector body 1134 faces edge 1137 of BIPV module 1130 when connector body 1134 is in the extended position (not shown) and faces away from edge 1137 when connector body 1134 is in the retracted position (shown in FIG. 11D). Moving between extended and retracted positions can involve a flip motion. To allow this flip motion of connector body 1134, extension body 1132 may form a loop around connector body 1134. A jumper (not shown) may be attached to connector body 1134 at side 1136. As shown in FIG. 11D, a structure including retracted connector 1131 and insert provides sufficient space 1138, such as a cavity, adjacent to side 1136 to accommodate the jumper or form an electrical connection to an inverter.

Figure 12:
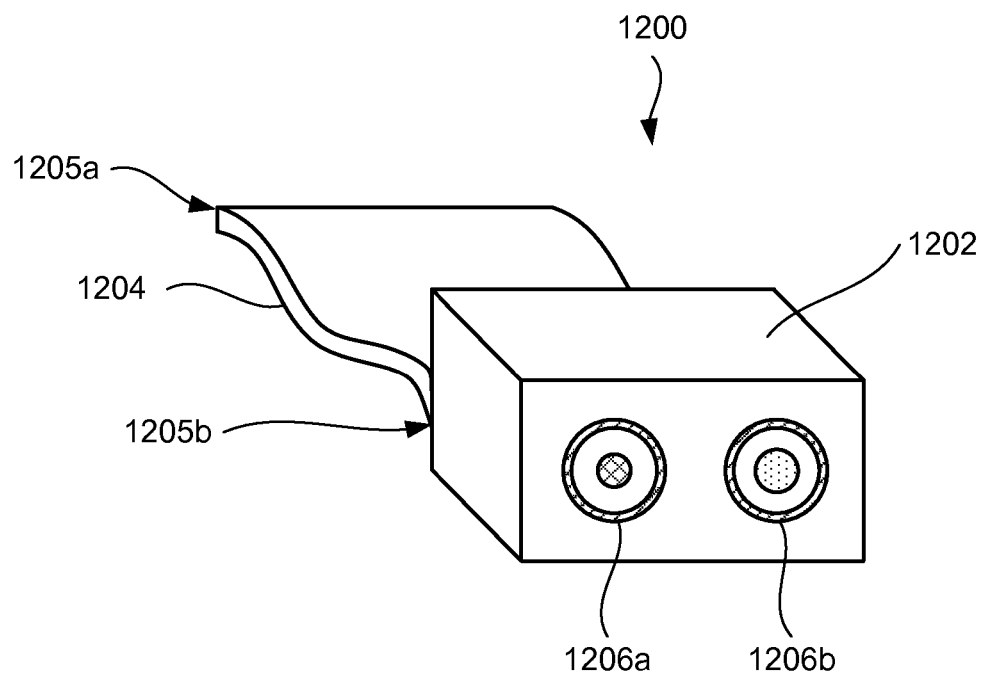
FIG. 12 is a perspective schematic view of a module connector including a connector body and extension body, in accordance with certain embodiments.

FIG. 12 is a schematic perspective view of a module connector 1200, in accordance with certain embodiments. Module connector 1200 includes a connector body 1202 and an extension body 1204. Extension body 1204 provides flexible attachment of connector body 1202 to a photovoltaic insert (not shown in FIG. 12) and includes a flexible portion that provide flexibility between two ends 1205a and 1205b of extension body 1204. Specifically, end 1205a can be attached to the photovoltaic insert, while end 1205b is attached to connector body 1202. This flexibility allows ends 1205a and 1205b to move with respect to each other in one or more directions and/or around one or more axes. Specifically, flexibility allows moving connector body 1202 between its extended and retracted positions as explained above. Furthermore, flexibility allows accommodating thermal expansion variations as well as certain misalignments of the supporting building structures and/or modules. It may be also useful during installation and replacement of BIPV modules and may allow installers to remove and replace one module without substantially disturbing other adjacent modules positioned in the same and/or adjacent rows.

Connector body 1202 may be made from a rigid material to provide mechanical support to conductive elements 1206a and 1206b and for engaging with other components, such as a joiner connector or a jumper. The rigidity of connector body 1202 does not interfere with the flexibility of extension body 1204. The rigidity of connector body 1202 may help during installation for making electrical connections, engaging with interlocking features, and other functions. The rigidity may be also useful to maintain mechanical and electrical connections between the connector body and other components, which in certain embodiments include the photovoltaic insert of the BIPV module.

Connector body 1202 and extension body 1204 have electrical conductors (not visible under the insulation forming outer surfaces of connector body 1202 and extension body 1204) providing electrical connections to conductive elements 1206a and 1206b. One conductor may interconnect one conductive element with the photovoltaic cells of the module, while another conductor may interconnect another conductive element with a bus bar as explained above. In general, the number of conductive elements in connector body 1202 determines the number of conductors in connector body 1202 and extension body 1204. One, two, three, or any other number of conductors and corresponding conductive elements may be present.

Portions of a conductor that extend along or through extension body 1204 are sufficiently flexible. For example, these portions may be made from a flat conductive strip having a width-to-thickness ratio of at least about 10 or, more specifically, of at least about 20 or even at least about 30. In the same or other embodiments, each one of these strips can have a width of between about 3 millimeters and about 18 millimeters and a thickness of between about 0.1 millimeters and about 0.6 millimeters. In a specific embodiment, this cross-section is about 0.2 millimeters thick and about 8 millimeters wide (i.e., having a cross-sectional area of about 1.6 millimeter-square). In certain embodiments, the conductor has a cross-sectional area of at least about 0.5 millimeter-square or, more particularly, at least about 1.0 millimeter-square, or even at least about 1.5 millimeter square. Each conductor may be rated to carry an electrical current of at least about 10 Amperes or, more specifically, at least about 20 Amperes or even at least about 30 Amperes. Conductors may be made from one or more of the following materials: copper, aluminum, nickel, silicon, beryllium, tin, tellurium, silver, phosphorous, cobalt, iron, zinc, chromium, zirconium, magnesium, titanium, and combinations thereof.

Conductors and conductive elements 1206a and 1206b of the connector may be formed (e.g., stamped) from one metal strip without need for subsequent interconnections or may be made from different components and interconnected (e.g., welded or soldered together) in later operations. For example, a progressive die may be used to create louvers, bends, and barrel shapes on and from the same metal strip. In other words, a progressive die and a single metal strip may be used to form all elements of one conductor.

The flexible portion of extension body 1204 may have a wave profile. For example, this portion may be shaped as a sinusoid or have any other suitable shaped profile, such as a series of repeated waves or other bent features. Conductors extending through this flexible portion are made from flexible insulated materials. Some examples of flexible materials include polyethylene, polypropylene, thermoplastic olefins, thermoplastic rubber, thermoplastic elastomer, ethylene propylene diene, monomer (EPDM), fluoroelastomers or thermoplastic vulcanizates (TPV), and flexible cast thermoset materials, such as urethanes or silicones. In general, various flexible thermoplastic elastomers that have suitable thermally durable behavior may be used. Specific examples include SANTOPRENE® (Supplied by Exxon Mobil in Houston, Tex.), HIPEX® (Supplied by Sivaco in Santa Clara, Calif.), EFLEX® (Supplied by E-Polymers Co., Ltd. in Seoul, Korea), ENFLEX® (Supplied by Enplast Limited in Longford, Ireland), EXCELINK® (Supplied by JSR Corporation in Tokyo, Japan), SYNOPRENE® (Supplied by Synoprene Polymers Pvt. Ltd. in Mumbai, India), and Elastron® (Supplied by Elastron Kimya in Kocaeli, Turkey), nitrile butadiene rubber (e.g., KRYNAC®, available from Lanxess in Maharashtra, India; NIPOL®, available from Zeon Chemicals in Louisville, Ky.; or NYSYN®, available from Copolymer Rubber & Chemicals in Batton Rouge, La.), hydrogenated nitrile butadiene rubber (e.g., THERBAN®, available from Lanxess in Maharashtra, India; ZETPOL®, available from Zeon Chemicals in Louisville, Ky.), and tetra-fluoro-ethylene-propylene (e.g., AFLAS®, available from Asahi Glass in Tokyo, Japan; DYNEON BRF®, available from 3M in St. Paul, Minn.; and VITON VTR®, available from DuPont Performance Polymers in Wilmington, Del.). In a particular embodiment, a portion of the conductor is encased in HIPEX® material, which has thermal and mechanical characteristics suitable for BIPV applications.

As shown, connector body 1202 is shown to include two conductive elements 1206a and 1206b, which may be enclosed in sockets formed within connector body 1202. Conductive elements 1206a and 1206b may be formed into sockets as further explained with reference to FIG. 13 or pins for fitting into the sockets. In certain embodiments, these sockets are substantially parallel to the back side of the photovoltaic in at least the retracted position. In the same or other embodiments, the sockets may be substantially perpendicular to the module edge that is adjacent to connector body. In other embodiments, these sockets may be substantially perpendicular to the back side of the photovoltaic in at least the retracted position or in both the retracted and extended positions. In these later embodiments, jumpers and joiner connectors may be engaged prior to installation of the module onto the building structure.

Conductive elements 1206a and 1206b may be formed as louvered metal strips or, more generally, as components with spring-type features. Spring-type features may be parts of conductive elements 1206a and 1206b and extend into cavities formed by the contact elements. The term "louvered sockets" may refer to sockets having spaced apart protrusions extending into the sockets' cavities. When a pin is inserted into such a socket cavity during installation, the spring-type features are pushed outwards and exert force on the inserted pin. In turn, this force may result in a lower electrical contact resistance than, for example, contacts without such spring-type features. A contact element with spring-type features may be made as a separate component and then connected to a conductive element or, alternatively, formed as a part of the overall conductor.

In certain embodiments, a connector may also include one or more interlocking features disposed on one or more connector bodies for interlocking with the module. These features may be configured to prevent connector bodies from sliding out of electrical contact with the module. Examples of interlocking features include latches, threads, and various recess-protrusion combinations. Interlocking features may be provided between the jumper and connector body and/or between the connector body and back side of the module.

Figure 13:
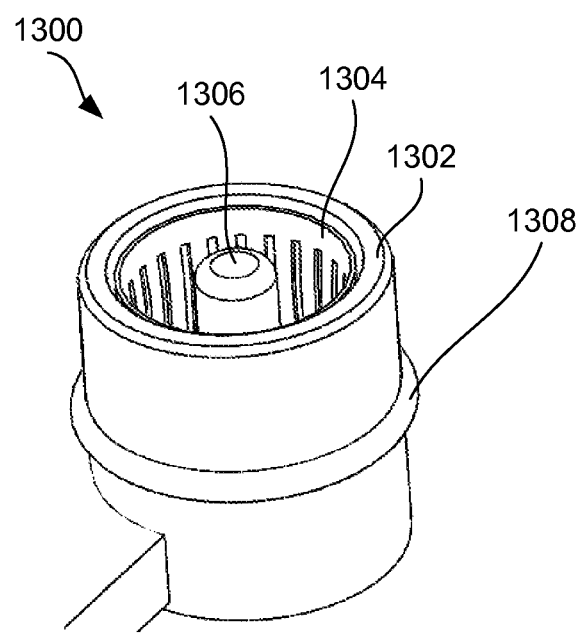
FIG. 13 is a perspective schematic view of a conductive element of the connector body, in accordance with certain embodiments.

FIG. 13 is a schematic expanded view of a portion of connector body 1300, in accordance with certain embodiments. Connector body 1300 includes a conductive element 1304 positioned within an insulating shell 1302. Conductive element 1304 may be connected to the photovoltaic cell or bus bar of the module. It is configured to form an electrical connection with a corresponding conductive element of the jumper or joiner connector. Conductive element 1304 may be made from one or more of the following materials: copper, aluminum, nickel, silicon, beryllium, tin, tellurium, silver, phosphorous, cobalt, iron, zinc, chromium, zirconium, magnesium, titanium, and combinations thereof. In certain embodiments, conductive element 1304 forms a cavity for insertion of an electrical contact of the jumper or joiner connector. The cavity may include an insulating pin 1306 to prevent the accidental touching of conductive element 1304 prior to installation. Insulating pin 1306 may be made from the same materials as insulating shell 1302, such as rigid polymer material. In certain embodiments, an insulating sheath of the extension body, insulating shell 1302, and insulating pin 1306 are made in a single operation, such as injection molding utilizing single stage or multiple stage injection cycles. In other embodiments, these components are made from different materials and may be mechanically interconnected by over-molding or other techniques. For example, insulating shell 1302 and insulating pin 1306 may be made from one or more of the rigid materials listed above. In the same embodiments, the flexible insulating sheath (not fully depicted in FIG. 13) may be made from one or more of the flexible materials listed above. The mechanical connection between these components made from different materials may be provided by over-molding one material over another material. Furthermore, electrical components insulated by these materials may provide some structural support. In specific embodiments, insulating shells 1302 and insulating pins 1306 may be formed in an initial injection molding operation, while the insulating sheath extending over some portions of insulating shells 1302 may be formed in a later injection molding operation. The overlap between two materials is generally referred to as "overmold." In the same or other embodiments, an initial injection molding operation may be used to form mechanical supports to some electrical components, (e.g., conductive element 1304) with respect to other elements of the conductor. This injection molding operation usually uses special mechanical supports positioned within the molding cavity of the injection molding apparatus. These mechanical supports are then removed, and the process proceeds with another injection molding operation to form other components of the connector.

Connector body 1300 may include a seal 1308 extending around insulating shell 1302 and configured to seal the mechanical connection or, more specifically, any gap between connector body 1300 and a portion of the jumper or joiner connector module used for connecting to connector body. The seal may be formed using an O-ring or other sealing components and material, (e.g., silicone sealant, butyl rubber inserts). In certain embodiments, a corresponding seal is provided on a module in addition to or instead of seal 1308 on connector body 1300.

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A building integrable photovoltaic module comprising:
   a photovoltaic insert comprising a front side, a back side, and an edge that defines a boundary of an exterior of the photovoltaic insert;
   one or more photovoltaic cells disposed between the front side and the back side;
   a cavity interposed between the front side and the back side, and extending through the edge of the photovoltaic insert and only partially through the photovoltaic insert; and
   a module connector comprising a connector body and an extension body, wherein:
   the connector body comprises two conductive elements,
   at least one of the two conductive elements is electrically coupled to the one or more photovoltaic cells,
   the extension body is flexible, having a first end that extends from a wall of the cavity and a second end that is connected to the connector body, and the module connector is located within the cavity and movable between an extended position and a retracted position, wherein:

when in the extended position and the retracted position, the module connector is wholly within the cavity and does not extend beyond any boundary of the cavity nor beyond the edge of the photovoltaic insert, when in the extended position, the connector body is separated from the edge of the photovoltaic insert by a first distance, and when in the retracted position, the connector body is separated from the edge of the photovoltaic insert by a second distance that is greater than the first distance.

2. The building integrable photovoltaic module of claim 1, wherein, in the extended position, the connector body is positioned less than about 20 millimeters from the edge of the photovoltaic insert.

3. The building integrable photovoltaic module of claim 1, wherein the connector body moves by between about 3 millimeters and 20 millimeters between the extended position and the retracted position.

4. The building integrable photovoltaic module of claim 1, wherein the extension body forms a loop around the connector body when the connector body is in the retracted position.

5. The building integrable photovoltaic module of claim 1, wherein the connector body comprises one or more sockets enclosing the two conductive elements, the one or more sockets being substantially parallel to the back side of the photovoltaic insert.

6. The building integrable photovoltaic module of claim 1, wherein the connector body is movable with respect to the back side of the photovoltaic insert in two or more directions and/or around one or more axes.

7. The building integrable photovoltaic module of claim 1, wherein the connector body is movable with respect to the edge of the photovoltaic insert in at least a direction substantially perpendicular to the edge of the photovoltaic insert.

8. The building integrable photovoltaic module of claim 1, wherein the extension body comprises two flexible conductors insulated by a flexible insulating sheath, the two flexible conductors are electrically insulated from each other and electrically coupled to the two conductive elements of the connector body.

9. The building integrable photovoltaic module of claim 8, wherein each of the two flexible conductors comprises a flat conductive strip having a width-to-thickness ratio of at least about 10.

10. The building integrable photovoltaic module of claim 8, wherein each of the two flexible conductors comprises a flat conductive strip having a width of between about 3 millimeters and about 18 millimeters and a thickness of between about 0.1 millimeters and about 0.6 millimeters.

11. The building integrable photovoltaic module of claim 8, wherein the flexible insulating sheath comprises a base polymer material coated with a fluorinated polymer material.

12. The building integrable photovoltaic module of claim 11, wherein the base polymer material comprises one or more of the following materials: polyethylene, polypropylene, and polyethylene terephthalate.

13. The building integrable photovoltaic module of claim 1, wherein the connector body is configured to interlock with the back side of the photovoltaic insert in at least the extended position.

14. The building integrable photovoltaic module of claim 13, wherein the connector body is allowed to move within a predetermined range with respect to the edge of the photovoltaic insert while at least in the retracted position to accommodate for thermal expansion.

15. The building integrable photovoltaic module of claim 1, further comprising a jumper, wherein:

the jumper is electrically connected to the two conductive elements and connected to the connector body by an interlocking mechanism, and when in the retracted position, the jumper does not protrude past the edge of the photovoltaic insert.

16. The building integrable photovoltaic module of claim 1, further comprising a jumper, wherein:

the jumper is electrically connected to the two conductive elements and connected to the back side by an interlocking mechanism, and when in the retracted position, the jumper does not protrude past the edge of the photovoltaic insert.

17. The building integrable photovoltaic module of claim 1, wherein the extension body comprises a shaped portion to provide flexible attachment to the connector body.

* * * * *